(12) United States Patent
Hummler (10) Patent No.: US 6,620,677 B1
(45) Date of Patent: Sep. 16, 2003

(54) SUPPORT LINER FOR ISOLATION TRENCH HEIGHT CONTROL IN VERTICAL DRAM PROCESSING

(75) Inventor: Klaus M. Hummler, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/159,169

(22) Filed: May 31, 2002

(51) Int. Cl.[7] ......................................... H01L 21/8242
(52) U.S. Cl. ...................................................... 438/243
(58) Field of Search ......................................... 438/243

(56) References Cited

U.S. PATENT DOCUMENTS 5,188,976 A * 2/1993 Kume et al. ................ 435/52
6,429,068 B1 * 8/2002 Divakaruni et al. ........ 438/243

\* cited by examiner

Primary Examiner—David Nelms
Assistant Examiner—Thao Le
(74) Attorney, Agent, or Firm—Slater & Matsil, L.L.P.

(57) ABSTRACT

A method of manufacturing a vertical DRAM device (10) having isolation trenches (38) with a controlled height. A support liner (54) is disposed over support regions (18) of a wafer. A first insulating layer is disposed over the wafer, and the first insulating layer is removed from a top surface of the wafer, leaving a portion (52) of the first insulating layer disposed over at least the array region (16). The isolation trenches (38) may be recessed below a top surface of the wafer pad nitride (14), so that portions of the first insulating layer (52) are left remaining over the support liner (54) over the support region isolation trenches (38).

32 Claims, 9 Drawing Sheets

SUPPORT LINER FOR ISOLATION TRENCH HEIGHT CONTROL IN VERTICAL DRAM PROCESSING

CROSS-REFERENCE TO RELATED APPLICATIONS

This invention is related to U.S. patent application Ser. No. 09/895,672, filed on Jun. 29, 2001 by Malik et al., entitled, "Structure and Methods for Process Integration in Vertical DRAM Cell Fabrication", which is incorporated herein by reference.

TECHNICAL FIELD

The present invention relates generally to the fabrication of integrated circuits (IC's), and more particularly to the fabrication of memory IC's.

BACKGROUND

Semiconductor devices are used in a variety of electronic applications, such as personal computers and cellular phones, for example. One such semiconductor product widely used in electronic systems for storing data is a semiconductor memory, and a common type of semiconductor memory is a dynamic random access memory (DRAM).

A DRAM typically includes millions or billions of individual DRAM cells arranged in an array, with each cell adapted to store one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

DRAM storage capacitors are typically formed by etching deep trenches in a semiconductor substrate, and depositing and patterning a plurality of layers of conductive and insulating materials in order to produce storage capacitors that are adapted to store data, represented by a one or zero. Prior art planar DRAM designs typically comprise access FETs disposed in a subsequently deposited layer, disposed above and to the side of the storage capacitors.

The semiconductor industry in general is being driven to decrease the size of semiconductor devices on integrated circuits. Miniaturization is generally needed to accommodate the increasing density of circuits necessary for today's semiconductor products. More recent DRAM designs involve disposing the access FET directly above the storage capacitor, a design that is often referred to as a vertical DRAM, which saves space and results in the ability to place more DRAM cells on a single chip.

Both the array of DRAM cells and support devices for the DRAM cells such as logic circuits, gates, junctions, decoders, and drivers, as examples, are planar in a planar DRAM. In planar DRAM technology, isolation trenches (IT) are formed, a gate oxide is formed over the memory cells, and planar support devices are formed. The wafer is subjected to a number of wet etch processes that potentially may affect the isolation trench height after planarization. However, because these etch processes are well controlled, the isolation trench height is not impacted due to exposure to the etch processes after isolation trench planarization.

In vertical DRAM technology, support devices are typically disposed in one or more support regions that are separate from the vertical DRAM cell array region. Isolation trenches are disposed between individual DRAM cells and the various support devices in order to electrically isolate the memory cells and support devices, respectively, from one another. A vertical access FET is disposed over each DRAM cell. Then, an array top oxide (ATO) layer is disposed over the array region to form a vertical isolation layer for the array region while the support logic devices are being formed in the support region and vertical access FETs are being wired to the logic devices.

Whereas in planar vertical DRAM technology, isolation trench height after planarization is not substantially impacted by subsequent etch processes, in vertical DRAM manufacturing, a second planarization step is required after the isolation trench planarization in order to planarize the ATO. The vertical DRAM ATO planarization process is much more difficult to control, and contains more process steps, for example, often decreasing the isolation trench height and causing a variation in the height of the isolation trenches of the vertical DRAM device.

In vertical DRAM manufacturing, it is desirable to maintain the height of the isolation trenches in the support device region during the processing of the array region.

SUMMARY OF THE INVENTION

Embodiments of the present invention achieve technical advantages as a method of controlling the height of isolating trenches of a vertical DRAM using a support liner. The support liner preserves the isolation trench height and height variation of the vertical DRAM during the manufacturing process.

In one embodiment, a method of processing a semiconductor wafer is disclosed. The wafer has at least one array region and at least one support region, the array region including a plurality of vertical DRAM cells and the support region including a region reserved for support circuitry for the vertical DRAM cells. The array and support regions include a plurality of isolation trenches formed therein, and the wafer includes a pad nitride disposed thereon. The method includes disposing a support liner over the wafer support region, disposing a first insulating layer over the wafer, and planarizing the wafer to remove the first insulating layer from at least the support region and leave a portion of the first insulating layer in the array region. The support liner in the wafer support region protects the isolation trench top surface during the planarization of the wafer.

Also disclosed is a method of manufacturing a vertical DRAM device, including providing a semiconductor wafer comprising a workpiece, the workpiece including at least one array region and at least one support region, forming a pad nitride over the workpiece, and forming a plurality of vertical DRAM cells in the at least one array region of the workpiece. The method includes forming a plurality of isolation trenches in the array region and the support region, disposing a support liner over the workpiece, removing the support liner from the workpiece array region and disposing a first insulating layer over the workpiece. The first insulating layer is removed from a top surface of the workpiece, leaving a portion of the first insulating layer disposed over at least the array region.

Advantages of embodiments of the invention include providing a method of manufacturing vertical DRAM structure having isolation trenches with a well-controlled height within support regions of the wafer. The support liner protects the isolation trenches in the support region during the processing of the array region of the wafer. The original isolation trench height after planarization of the isolation trenches may be preserved through the array top oxide deposition and planarization processes. Height variation of isolation trenches across the surface of the wafer is also well-controlled in accordance with embodiments of the present invention.

BRIEF DESCRIPTION OF THE DRAWINGS

The above features of embodiments of the present invention will be more clearly understood from consideration of the following descriptions in connection with accompanying drawings in which:

FIGS. 1–10 illustrate cross-sectional views of a vertical DRAM device at various stages of fabrication in accordance with an embodiment of the present invention.

FIGS. 1, 2, 6–7 and 10 include both an A and B figure. The B figures depict a view perpendicular to the wafer from the view shown in the respective A figures in the array region. The B figures show isolation trenches that reside between each vertical DRAM cell.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Problems with prior art methods of processing vertical DRAMs will be discussed, followed by a description of preferred embodiments of the present invention and some advantages thereof. A cross-section of one memory cell is shown in each figure, although many other memory cells and components of memory cells may be present in the semiconductor devices shown. Only one array region and one support region is shown in each figure, although one or more array regions may reside on the wafer.

There are three typical process flows used in vertical DRAM manufacturing: TOE, TON and TOL. In a top oxide early (TOE) process, the top oxide is formed early in the process by stripping the pad nitride out of the array region, and replacing the pad nitride with an array top oxide. Then the pad nitride is stripped out of the support regions, and the support devices are processed. The process is referred to as "TOE" because the array Top Oxide is formed Early (TOE) in the process.

In a TOE process, because the array region pad nitride is stripped first, the ATO CMP process can cause support isolation trench height variations. Particularly, in conjunction with a fixed abrasive CMP, the ATO CMP process may leave residue in the support regions that can lead to extreme variations in final isolation trench height.

Another process is referred to as top oxide nitride (TON), described in related U.S. patent application Ser. No. 09/895,672, filed on Jun. 29, 2001 by Malik et al., entitled, "Structure and Methods for Process Integration in Vertical DRAM Cell Fabrication", which is incorporated herein by reference. The pad nitride is stripped from both the support and array regions, and a nitride liner is deposited in both the support and array regions. A top oxide is formed in both the support and array regions, and then the top oxide is stripped out of the support area, using the nitride liner as an etch stop. A disadvantage of this process is that the ATO CMP step may break through the TON liner, causing a catastrophic recess of the support isolation trenches during ATO strip or removal in the support region.

Another process is referred to in the art as a top oxide late (TOL) process, in which the pad nitride is stripped out of the support regions, and support devices are formed in the support regions. The pad nitride is then stripped from the array regions, and then an array top oxide is formed in the array regions. The TOL process can also result in isolation trench height variations in the support region, due to CMP.

Isolation trench height is critical in support regions of a vertical DRAM device, because if the isolation trenches are allowed to drop down below the silicon (e.g., substrate) level, a wrap-around effect can occur; that is, the gate of the support devices can wrap around the corner and the threshold voltages of the support devices may be altered. Therefore, the minimum isolation trench height is ideally above the silicon or substrate surface. On the other hand, the maximum isolation trench height is typically determined by the gate conductor etch. The gate conductors comprise conducting lines that run up and over the topography of the top surface of the wafer support region. If the vertical step of the wafer topography is too large, then the gate conductor etch process may fail to etch the gate conductors as designed.

The present invention comprises a TOE process that includes a support liner that is formed over the support region to maintain isolation trench height during the processing of the array region. The isolation trenches in the support region may be recessed to further prevent variations in the support region isolation trench height.

Embodiments of the present invention achieve technical advantages by forming a support liner after isolation trench planarization to preserve isolation trench height in the support region during processing of the array region, for example, during ATO processing. The support liner preserves the original isolation trench height as achieved after an isolation trench CMP process, and eliminates additional variations in isolation trench height across the wafer surface. In a preferred embodiment, the support liner also provides an increased process window with respect to CMP breakthrough.

A process flow for utilizing a support liner disposed over isolation trenches in wafer support regions during the manufacturing process for a vertical DRAM 10 in accordance with an embodiment of the present invention will next be described.

Figure 1A:
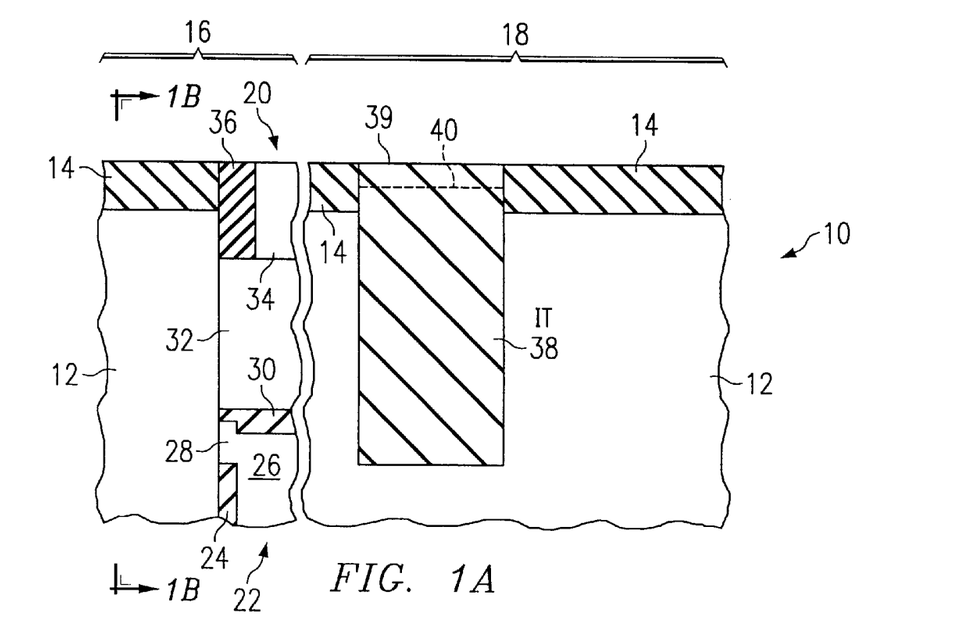

A workpiece 12 is provided, as shown in FIG. 1A. The workpiece 12 includes a substrate typically comprising a semiconductor material such as single-crystal silicon. The workpiece 12 may include other conductive layers or other semiconductor elements such as transistors or diodes disposed therein, as examples. The workpiece 12 may alternatively comprise other semiconductors such as GaAs, InP, Si/Ge, SiC, or compound semiconductors, as examples. The workpiece 12 is also referred to herein as a wafer.

A pad nitride 14 is deposited over the workpiece 12. The pad nitride 14 may comprise silicon nitride deposited in a thickness of 100–300 nm, for example, and alternatively, pad nitride 14 may comprise other nitride materials.

The wafer is patterned using conventional lithography techniques and etched to form deep trenches 20 in the workpiece 12 and pad nitride 14, as shown. The deep trenches 20 may be 8 $\mu$m deep and 200 nm in diameter wide, as examples, although these parameters are a function of the ground rules for the particular device being manufactured. Only a top portion of a deep trench 20 is shown in FIG. 1A.

The workpiece 12 comprises at least one array region 16 and at least one support region 18. The array region 16 may comprise a plurality of vertical DRAM cells 22 arranged in an array pattern of rows and columns, for example. The support region 18 is reserved for the formation of support circuitry, such as logic circuits, gates, junctions, decoders, and drivers, as examples, for the vertical DRAM cells 22, wherein the support circuitry will be formed later.

The array region 16 and support region 18 are preferably processed in separate manufacturing procedures; for example, the support region 18 may be protected with an etch array (EA) mask while the array region 16 is processed, and later, the array region 16 may be protected with an etch support (ES) mask while the support region 18 is processed. Later in the processing of the support region 18, the pad nitride 14 will be removed so that support devices may be formed within the substrate 12 in the support region 18, for example.

Each vertical DRAM cell 22 preferably comprises a buried plate (not shown) and a storage capacitor formed in the deep trench 20, as examples. The vertical DRAM cell 22 may comprise a collar oxide 24 and capacitor inner plate 26 disposed thereon. A buried strap 28 is formed proximate the top portion of the capacitor inner plate 26. A trench top oxide (TTO) 30 is formed over the capacitor inner plate 26 and buried strap 28, as shown. A gate oxide (not shown) is deposited over the trench sidewalls and TTO 30, and a gate electrode 32 preferably comprising a semiconductor material, for example, is disposed over the gate oxide. An inner spacer 36 comprising an insulator such as a nitride material, for example, is formed over the gate electrode 32 for the deep trench top isolation, and a gate electrode contact 34 preferably comprising a semiconductor material, for example, is formed adjacent the spacer 36 and is electrically coupled to the gate electrode 32.

Figure 1B:
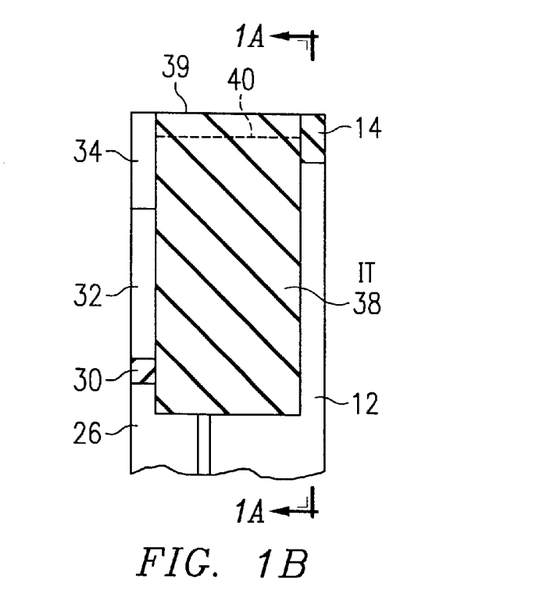

Isolation trenches 38 are formed in the array region 16 and support region 18. FIG. 1B shows a cross-sectional view of the active area of the array, in a view perpendicular to view shown in FIG. 1A. Isolation trenches 38 are visible in the array region in the view shown in FIG. 1B. Isolation trenches 38 preferably comprise an insulator such as an oxide, for example. Isolation trenches 38 may be formed by depositing the insulator over the entire workpiece 12, and planarizing the workpiece 12, for example using a CMP process, to expose the top surface of the pad nitride 14 such that the top surface 39 of the isolation trenches 38 is coplanar with the pad nitride 14 top surface.

In this embodiment, the top surfaces of the isolation trenches 38 are recessed to a predetermined height 40 beneath the top surface of the pad nitride 14, as shown in FIGS. 1A, 1B, 2A and 2B. In another embodiment, the isolation trenches 38 are not recessed, but rather, the top surfaces 39 remain coplanar with the top surface of the pad nitride 14 at their original height 39 post-CMP, to be described further herein with respect to FIG. 11.

Figure 2A:
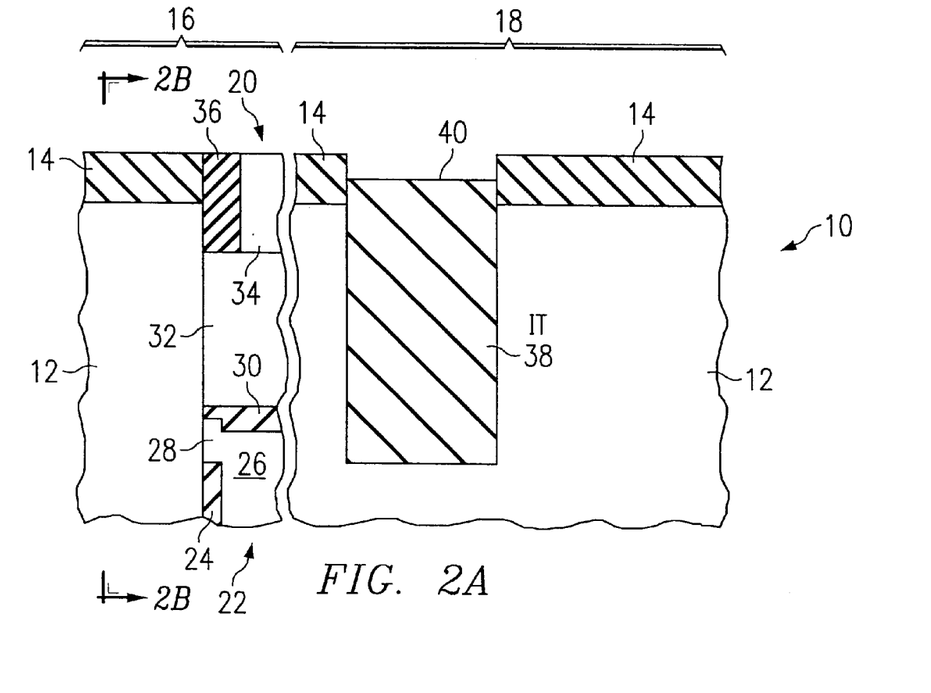
Figure 2B:
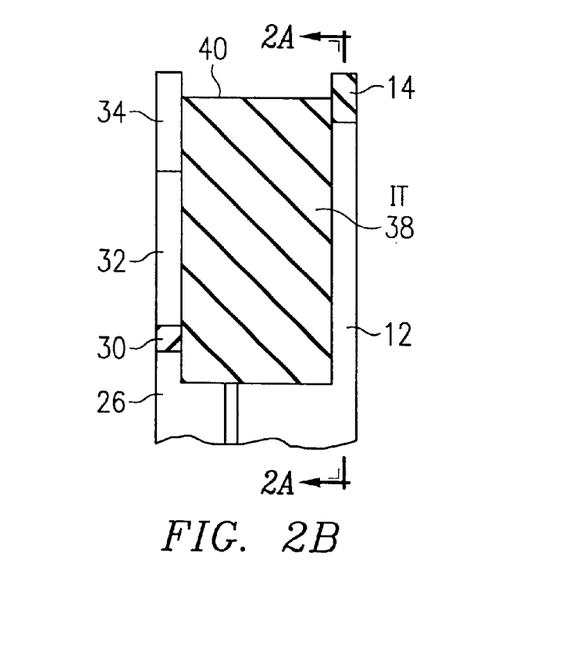

Referring again to FIGS. 2A and 2B, in the optional isolation trench 38 recess step, preferably, the isolation trenches 38 are etched back to a height equal to approximately half the thickness of the pad nitride 14, for example. Alternatively, the isolation trenches 38 may be etched back between about 100 to 400 Angstroms below the top surface of the pad nitride 14, as examples. FIG. 2B shows a cross-sectional view of the active area of the array, in a view perpendicular to view shown in FIG. 2A.

Figure 3:
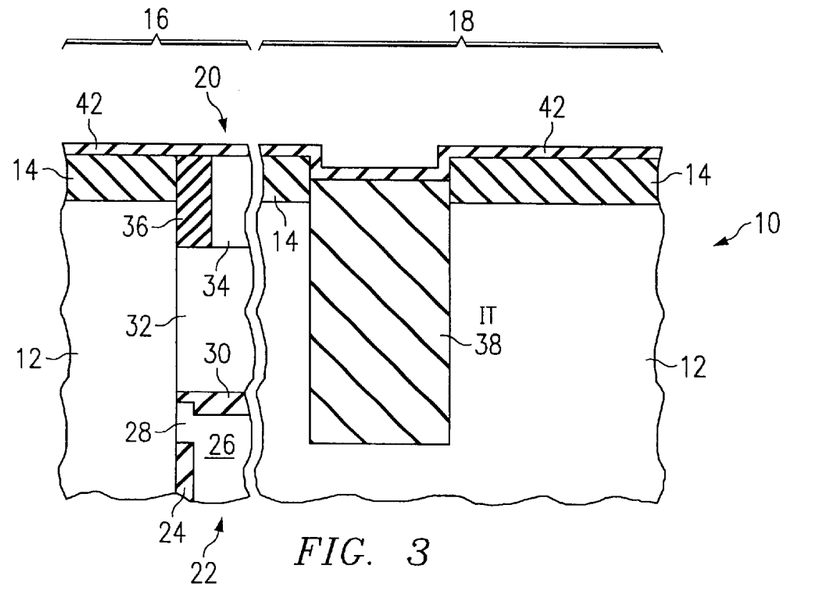
Figure 6A:
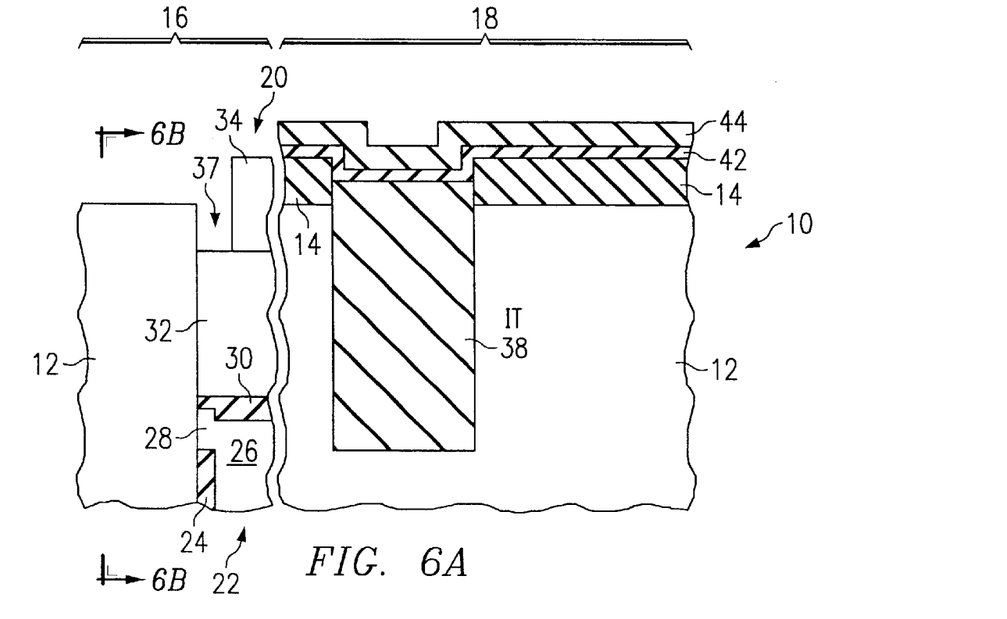
Figure 6B:
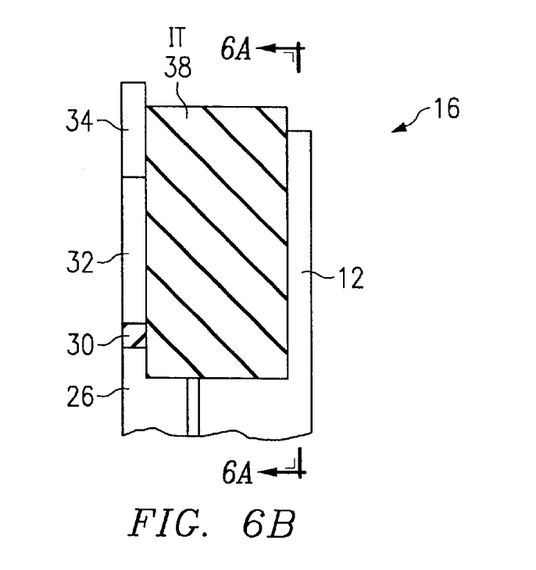

In accordance with embodiments of the present invention, a support liner 42 is formed over the support region 18 of the workpiece. Preferably, forming the support liner 42 over the support region 18 comprises depositing a support liner 42 over the entire workpiece 12, e.g., over both the array region 16 and support region 18, to line the pad nitride 14, isolation trenches 38, and other top surfaces of exposed elements such as spacer 36 and gate electrode contact 24, as examples, as shown in FIG. 3. The support liner 42 is later removed from over the array region 16 to leave the support liner 42 disposed over the support region 18, as shown in FIGS. 6A and 6B, to be described further herein.

Preferably, the support liner 42 comprises a nitride such as silicon nitride, deposited in a thickness of 150–250 Å, as an example. The support liner 42 may alternatively comprise other nitrides or a semiconductor material such as polysilicon, as examples. The support liner 42 is preferably conformal and is preferably deposited over the entire top surface of the wafer.

Figure 4:
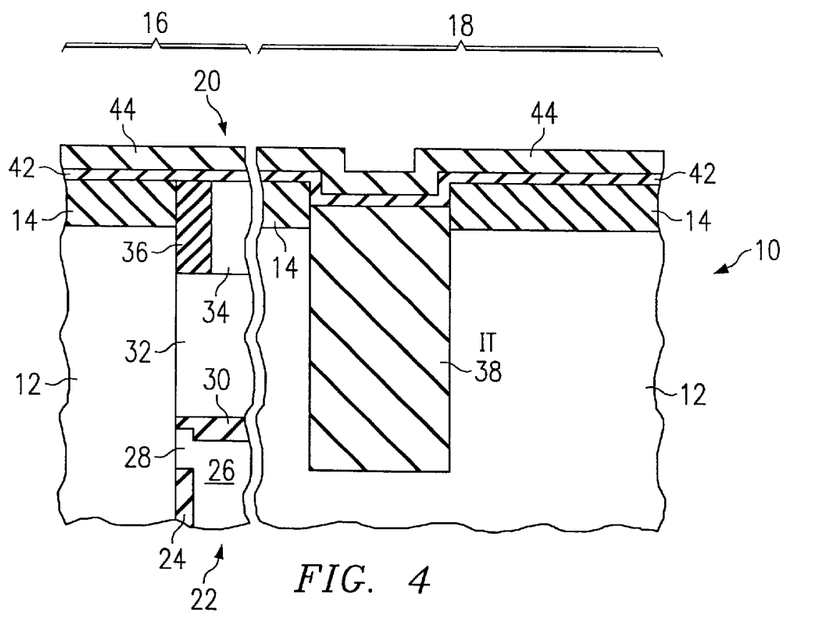

A mask 44 is disposed over the wafer to cover the support liner 42, as shown in FIG. 4. The mask 44 preferably comprises an oxide hard mask, and alternatively may comprise polysilicon, for example, if the support liner 42 comprises SiN. Alternatively, the mask 44 may comprise a nitride such as SiN, for example, if the support liner 42 comprises polysilicon. The mask 44 may also comprise other materials.

Figure 5A:
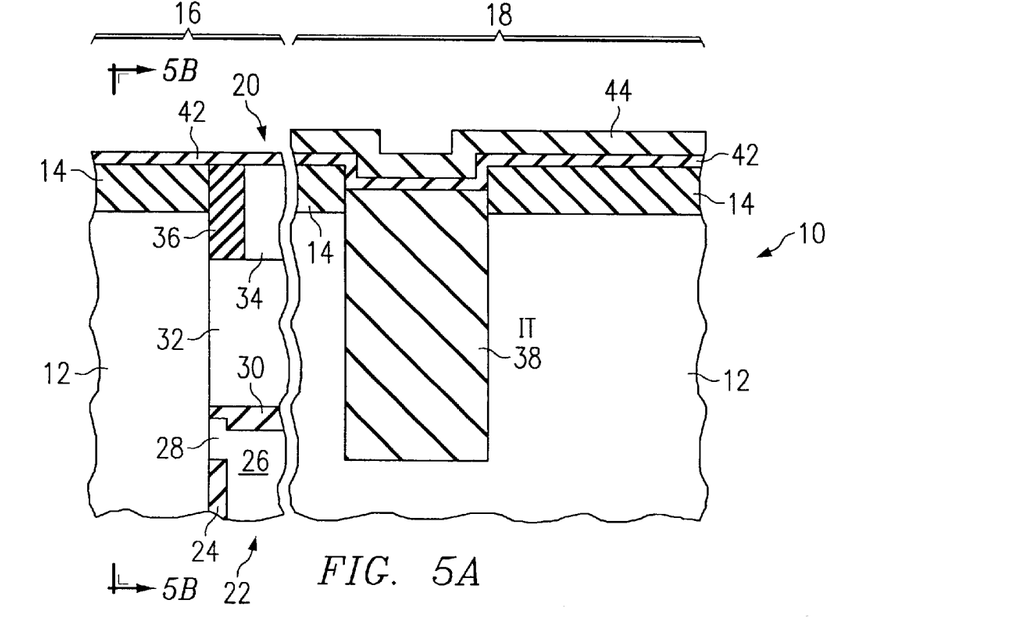
Figure 5B:
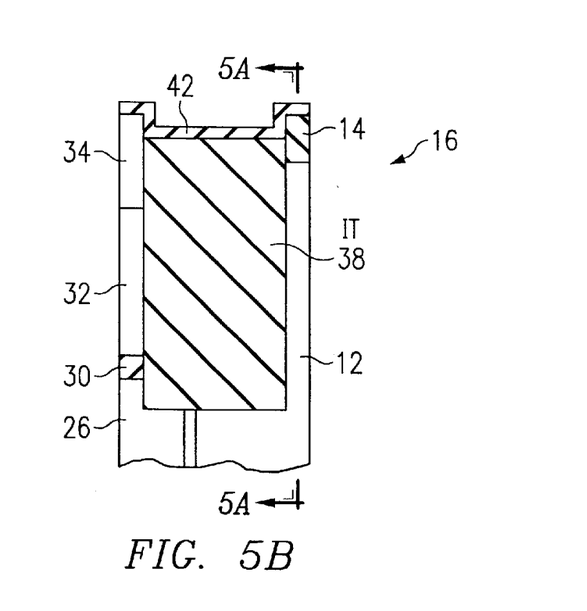

The mask 44 is patterned, for example, using lithography and a resist (not shown), and portions of the mask 44 are removed in the array region 16, as shown in FIGS. 5A and 5B.

The mask 44 is used to remove at least the support liner 42 from the wafer array region, with the mask 44 left remaining over the support region 18, as shown in FIG. 6A and 6B. The support liner 42 is removed from the array region 16, and the pad nitride 14 and spacer 36 are removed from the array region 16. If the support liner 42 comprises a nitride, then advantageously, the support liner 42, pad nitride 14, and spacer 36 are removable in a single etch process, using the hard oxide mask 44 as a mask during the nitride etch process.

Figure 7A:
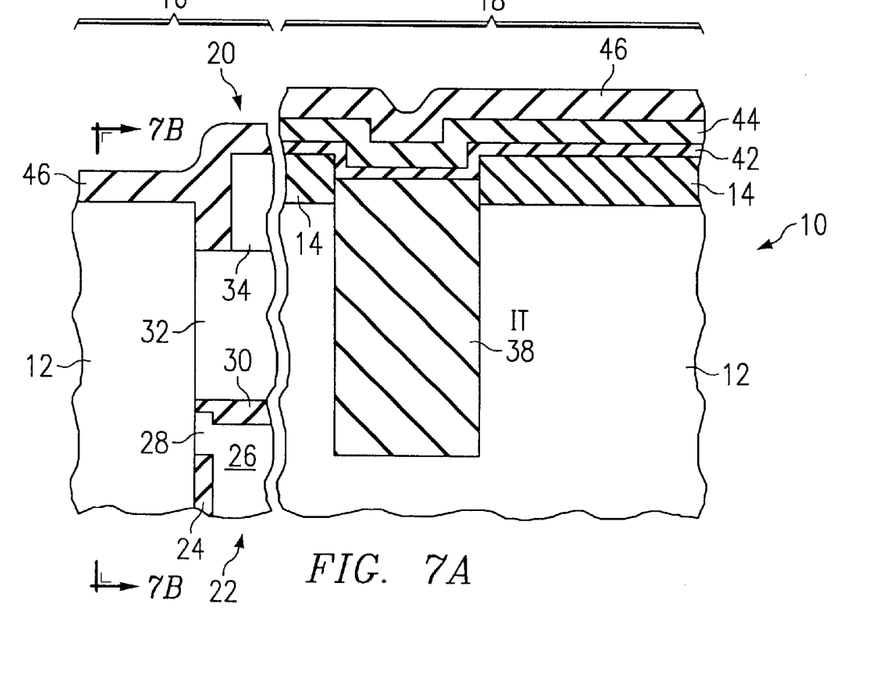
Figure 7B:
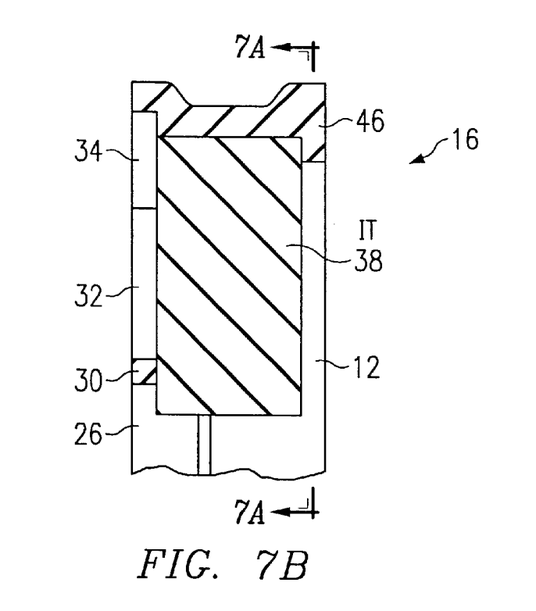

Removing the pad nitride 14 from the array region 16 results in the removal of spacer 36, leaving a divot or trench 37, as shown. The next step is to fill this divot 37 with an insulating material 46. An insulating material 46 is deposited over the entire surface wafer, as shown in FIGS. 7A and 7B. The insulating material 46 preferably comprises a nitride such as silicon nitride and has a thickness sufficient to fill the trench 37 left open after the spacer 36 is removed (as shown in FIG. 6A). For example, insulating material 36 may be 30 nm thick. Preferably the insulating material 46 is conformal and is deposited in a thickness that is equal to at least half of the width of the divot 37.

Figure 8:
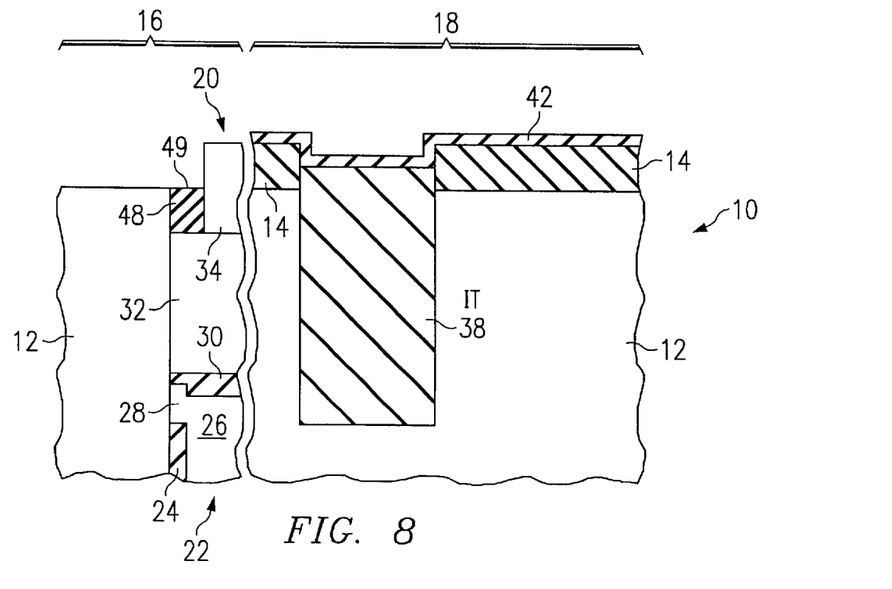

The insulating material 46 is etched back from the surface of the support region 18 and from the surface of the workpiece 12 in the array region 16, as shown in FIG. 8, leaving a spacer 48 adjacent the gate electrode contact 34 that fills the divot 37. The insulating material 46 may be etched using an isotropic etch having little over-etch, using an etchant such as hot phosphoric acid etchant, as an example, although other etches may be used to remove the excess insulating material 46. The mask 44 may then be removed from the support region 18, as shown. The top surface 49 of the spacer 48 is preferably coplanar with the substrate 12, and alternatively, the spacer top surface 49 may be slightly recessed below the top surface of the substrate 12, not shown.

Figure 9:
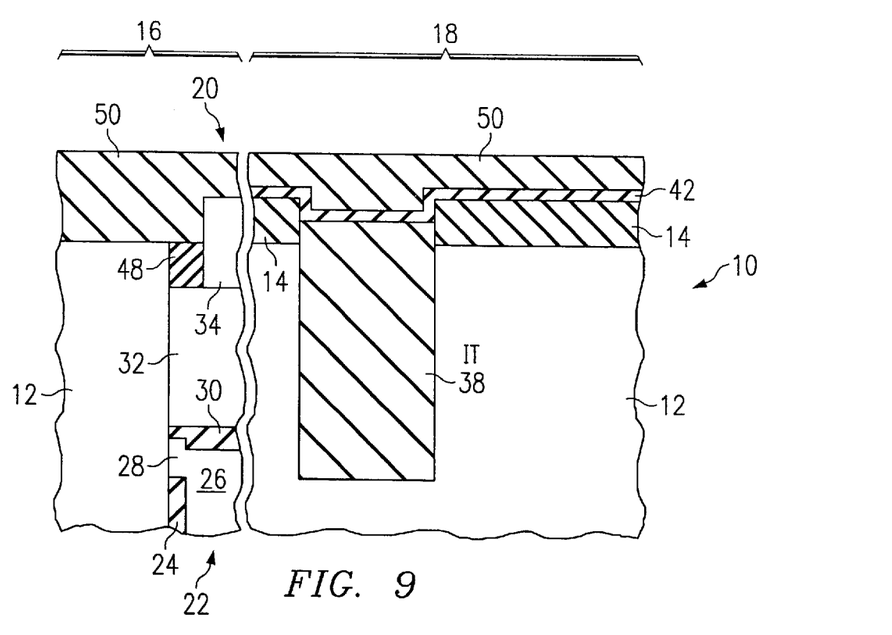
Figure 10A:
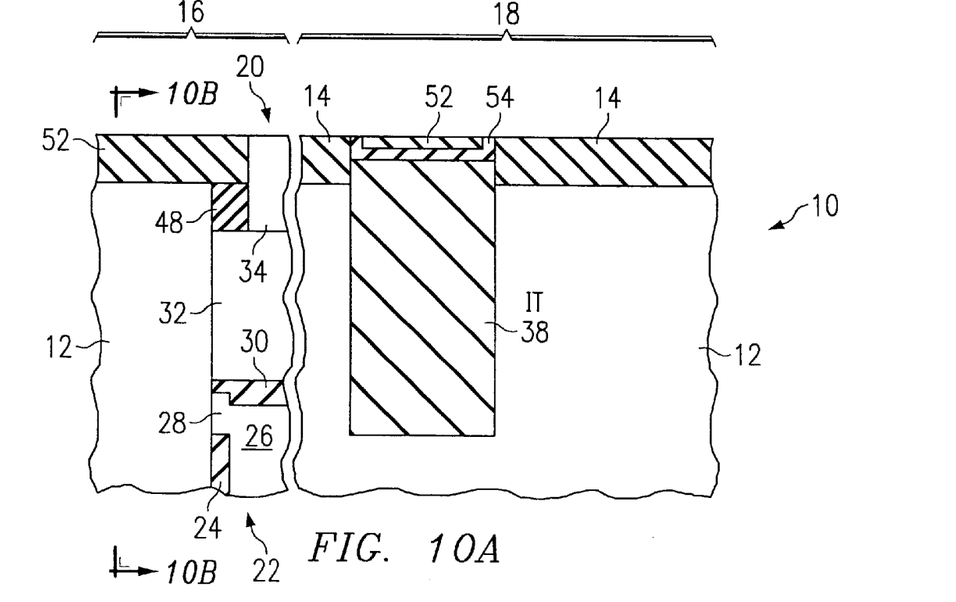
Figure 10B:
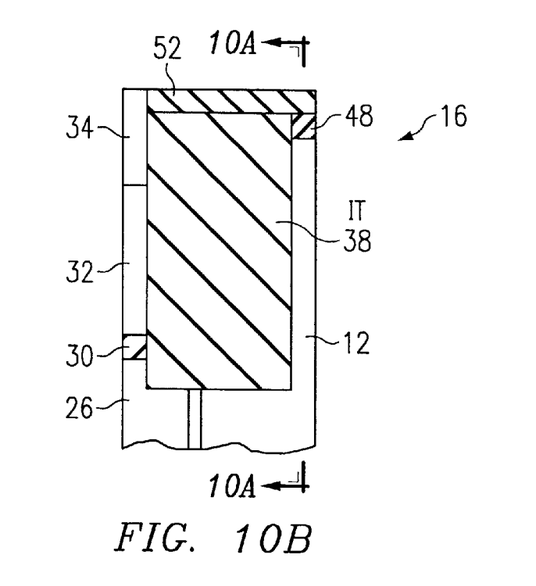

An insulating material 50 is deposited over the wafer, as shown in FIG. 9. The insulating material 50 is also referred to herein as a first insulating material and an array top oxide. The insulating material 50 preferably comprises an oxide such as SiO$_2$, for example. The insulating material 50 is removed from the top of the gate electrode contact 34; for example, a planarizing anti-reflective coating (ARC) followed by a dry etch such as a reactive ion etch (RIE) may be used to remove portions of the insulating material 50 and the support liner 54 residing on the pad nitride 54 in the support regions 18, as shown in FIGS. 10A and 10B. Alternatively, the insulating material 50 may be removed from the gate electrode contact 34 top surface by CMP, stopping on the gate electrode contact 34, or by other methods, for example. The insulating material 52 left remaining in the array region 16 comprises the array top oxide, and the insulating material 52 resides over the isolation trenches 38 (see FIG. 10B), workpiece 12 and spacer 48 in the array region 16.

In the embodiment shown in FIG. 10A, the insulating material 52 also resides over the support liner 54 over the isolation trenches 38 in the support region 18. This is advantageous because the support liner 54 and insulating material 52 provide an increased process margin for the isolation trenches 39. For example, the height of the isolation trenches 38 will not be decreased during the wafer processing, such as during insulating material 50 CMP, because support liner 54 and insulating material 52 protect the support region isolation trench 38 height. The process window against overpolishing of the isolation trenches 38 is large because the support liner 42 is below the top surface of the pad nitride 14 in the support region 18.

The pad nitride 14 in the support region 18 is removed, and further processing of the wafer is continued, such as the formation of support devices in the support region 18, as an example.

Figure 11:
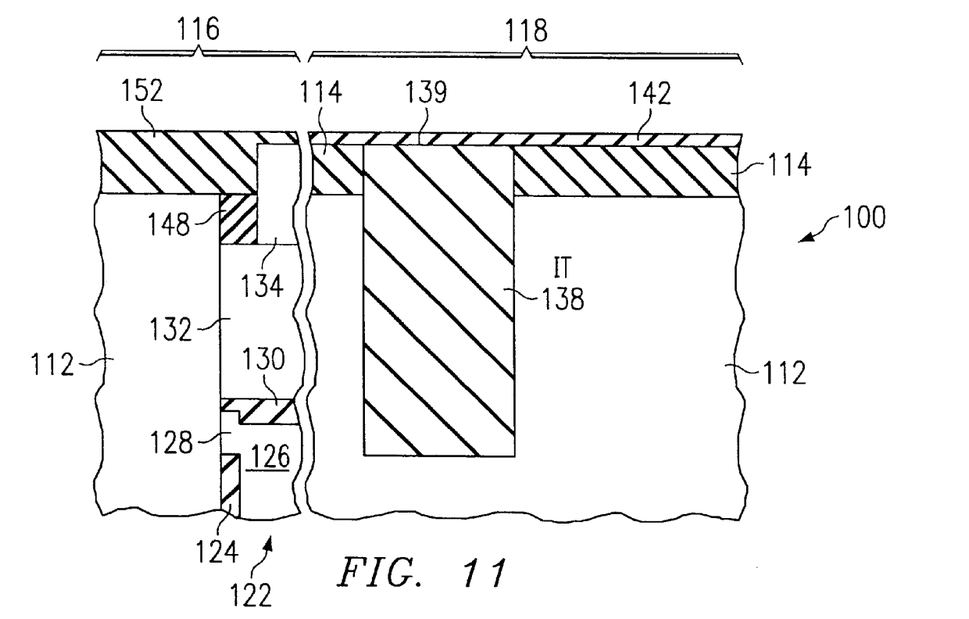
FIG. 11 illustrates a cross-sectional view of an embodiment of the invention wherein the isolation trenches are not recessed after planarization.

In another embodiment of the present invention, shown in FIG. 11, the isolation trenches 38 are not recessed, but rather, isolation trenches 38 have a height 39 equal to the pad nitride 14 top surface height, as shown in FIG. 1A. The wafer is processed using the same manufacturing processes as described for FIGS. 3–9, with the etch-back of the oxide 50 stopping on the support liner 142, as shown in FIG. 11.

In this embodiment, after the vertical DRAM 100 has been completely processed, the isolation trenches 138 remain at the same height 139 after the CMP of the isolation trenches 138. Portions of the oxide 152 do not reside over the isolation trenches 138 in the support region 118 in this embodiment. Because a portion of the oxide 152 is left remaining over gate electrode contact 134, an etch process may need to be utilized to remove oxide 152 over the gate electrode contact 134 in order to electrically couple the gate electrode contact 134 to subsequent layers.

After reaching the processing stages shown in FIGS. 10A, 10B, and 11, further processing of the vertical DRAM is continued, such as depositing an etch support mask, support region oxide etch, pad nitride strip in the support region (for the embodiments shown in FIGS. 10 and 11), followed by TOE-type processing, as examples.

While embodiments of the present invention are primarily described herein with reference to DRAM devices, they also may have useful application in ferroelectric random access memory (FRAM) devices and other semiconductor devices, as examples.

Advantages of embodiments of the invention include providing a method of manufacturing a vertical DRAM structure having isolation trenches with a well-controlled height within support regions of the wafer. The support liner 42/142 protects the isolation trenches 38/138 in the support region 18/118 during the processing of the array region 16/116 of the wafer. The original isolation trench 38/138 height after planarization of the isolation trenches 38/138 is preserved through the array top oxide deposition and CMP processes due to the presence of the support liner 42/142. Height variation of isolation trenches 38/138 across the surface of the wafer is also well-controlled in accordance with embodiments of the present invention. Embodiments of the invention result in an improved process window and a more robust processing flow for memory devices such as vertical DRAMs.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of processing a semiconductor wafer having at least one array region and at least one support region, the array region including a plurality of vertical dynamic random access memory (DRAM) cells and the support region including a region reserved for support circuitry for the vertical DRAM cells, the array and support regions including a plurality of isolation trenches formed therein, the wafer including a pad nitride disposed thereon, wherein the method comprises:

disposing a support liner over the wafer support region;

disposing a first insulating layer over the wafer; and planarizing the wafer to remove the first insulating layer from at least the support region and leave a portion of the first insulating layer in the array region, wherein the support liner in the wafer support region protects the isolation trench top surface during the planarization of the wafer, further comprising etching back the isolation trenches to a predetermined height below a top surface of the pad nitride after forming the plurality of isolation trenches, wherein removing the first insulating layer from a top surface of the wafer comprises leaving a portion of the first insulating layer disposed over the support liner in the support region.

2. The method according to claim 1, wherein disposing the support liner comprises disposing a nitride or a semiconductor material, and wherein disposing a first insulating layer comprises disposing an oxide or a semiconductor material.

3. The method according to claim 2, wherein depositing the support liner comprises depositing 150–250 Å of material.

4. The method according to claim 1, wherein the isolation trenches are etched back to between about 100 to 400 Angstroms below the top surface of the pad nitride.

5. The method according to claim 1, wherein disposing a support liner over the wafer support region comprises:

depositing the support liner over the wafer support region and wafer array region; and removing the support liner in the wafer array region.

6. The method according to claim 5, wherein removing the support liner in the wafer array region further comprises removing the pad nitride from the wafer array region.

7. The method according to claim 6, wherein removing the support liner further comprises removing a spacer adjacent a vertical gate contact of the DRAM cells.

8. The method according to claim 5, wherein removing the support liner from the wafer array region comprises:

disposing a mask over the support liner;

patterning the mask;

removing portions of the mask;

using the mask to remove the support liner from the wafer array region; and removing the mask.

9. The method according to claim 8, wherein disposing a mask comprises depositing an oxide or polysilicon.

10. The method according to claim 1, wherein planarizing the wafer comprises chemically-mechanically polishing the wafer.

11. The method according to claim 6, further comprising further processing the array region of the wafer, after removing the support liner from the array region.

12. The method according to claim 11, wherein further processing the array region comprises forming a spacer adjacent a vertical gate contact of at least one vertical DRAM cell.

13. The method according to claim 12, wherein forming the spacer comprises:

depositing a second insulating layer over the wafer; and removing a portion of the second insulating layer from the wafer, leaving a portion of the second insulating layer disposed adjacent the vertical DRAM cell vertical gate contact in the array region.

14. The method according to claim 13, wherein depositing a second insulating layer comprises depositing a nitride.

15. The method according to claim 1, further comprising forming support circuitry for the vertical DRAM cells in the support region of the wafer.

16. A vertical DRAM device manufactured by the method according to claim 14.

17. The method according to claim 1, wherein disposing a support liner comprises forming a non-conductive material over at least the wafer support region.

18. A method of processing a semiconductor wafer having at least one array region and at least one support region, the array region including a plurality of vertical dynamic random access memory (DRAM) cells and the support region including a region reserved for support circuitry for the vertical DRAM cells, the array and support regions including a plurality of isolation trenches formed therein, the wafer including a pad nitride disposed thereon, wherein the method comprises:

before forming the support circuitry in the support region, disposing an etch stop layer over at least the isolation trenches in the support region;

disposing a first insulating layer over the wafer; and planarizing the wafer to remove the first insulating layer from at least the support region and leave a portion of the first insulating layer in the array region, wherein the etch stop layer in the support region protects a top surface of the isolation trench during the planarization of the wafer.

19. The method according to claim 17, wherein disposing the etch stop layer comprises disposing a nitride or a semiconductor material, and wherein disposing the first insulating layer comprises disposing an oxide or a semiconductor material.

20. The method according to claim 18, wherein depositing the etch stop layer comprises depositing 150–250 Å of material.

21. The method according to claim 17, wherein disposing the etch stop layer comprises depositing a non-conductive material.

22. The method according to claim 18, wherein disposing the etch stop layer over the support region comprises:

depositing the etch stop layer over the support region and array region; and removing the etch stop layer in the array region.

23. The method according to claim 24, wherein removing the etch stop layer in the array region further comprises removing the pad nitride from the array region.

24. The method according to claim 23, wherein removing the etch stop layer further comprises removing a spacer adjacent a vertical gate contact of the DRAM cells.

25. The method according to claim 24, wherein removing the etch stop layer from the array region comprises:

disposing a mask over the etch stop layer;

patterning the mask;

removing portions of the mask;

using the mask to remove the etch stop layer from the array region; and removing the mask.

26. The method according to claim 25, wherein disposing the mask comprises depositing an oxide or polysilicon.

27. The method according to claim 18, wherein planarizing the wafer comprises chemically-mechanically polishing the wafer.

28. The method according to claim 22, further comprising further processing the array region, after removing the etch stop layer in the array region.

29. The method according to claim 28, wherein further processing the array region comprises forming a spacer adjacent a vertical gate contact of at least one vertical DRAM cell.

30. The method according to claim 29, wherein forming the spacer comprises:

depositing a second insulating layer over the wafer; and removing a first portion of the second insulating layer from the wafer, leaving a second portion of the second insulating layer disposed adjacent the vertical DRAM cell vertical gate contact in the array region.

31. The method according to claim 30, wherein depositing the second insulating layer comprises depositing a nitride.

32. The method according to claim 18, further comprising forming support circuitry for the vertical DRAM cells in the support region.

* * * * *

UNITED STATES PATENT AND TRADEMARK OFFICE
CERTIFICATE OF CORRECTION

PATENT NO. : 6,620,677 B1                                                Page 1 of 1
DATED      : September 16, 2003
INVENTOR(S) : Hummler

It is certified that error appears in the above-identified patent and that said Letters Patent is hereby corrected as shown below:

Column 9,
Line 24, replace "claim 6" with -- claim 5 --; and
Line 45, replace "claim 14" with -- claim 1 --.

Column 10,
Line 5, replace "claim 17" with -- claim 18 --;
Line 10, replace "claim 18" with -- claim 19 --;
Line 13, replace "claim 17" with -- claim 18 --;
Lines 22 and 29, replace "claim 24" with -- claim 22 --.

Signed and Sealed this

Seventeenth Day of February, 2004

JON W. DUDAS
*Acting Director of the United States Patent and Trademark Office*